(12) United States Patent
Polle et al.

(10) Patent No.: US 12,412,737 B2
(45) Date of Patent: *Sep. 9, 2025

(54) ROTARY MAGNETRON SPUTTERING WITH INDIVIDUALLY ADJUSTABLE MAGNETIC FIELD

(71) Applicant: INTERPANE ENTWICKLUNGS—UND BERATUNGSGESELLSCHAFT MBH, Lauenfoerde (DE)

(72) Inventors: Alexander Polle, Katlenburg (DE); Dominik Wagner, Hoexter (DE)

(73) Assignee: INTERPANE ENTWICKLUNGS—UND BERATUNGSGESELLSCHAFT MBH, Lauenfoerde (DE)

( * ) Notice: Subject to any disclaimer, the term of this patent is extended or adjusted under 35 U.S.C. 154(b) by 262 days.

This patent is subject to a terminal disclaimer.

(21) Appl. No.: 17/311,906

(22) PCT Filed: Apr. 7, 2020

(86) PCT No.: PCT/EP2020/059830
§ 371 (c)(1),
(2) Date: Jun. 8, 2021

(87) PCT Pub. No.: WO2020/221557
PCT Pub. Date: Nov. 5, 2020

(65) Prior Publication Data
US 2022/0028672 A1    Jan. 27, 2022

(30) Foreign Application Priority Data
Apr. 29, 2019  (EP) .................................. 19171486

(51) Int. Cl.
*H01J 37/34*    (2006.01)
*C23C 14/35*    (2006.01)
*C23C 14/54*    (2006.01)

(52) U.S. Cl.
CPC .......... *H01J 37/3455* (2013.01); *C23C 14/35* (2013.01); *C23C 14/54* (2013.01); (Continued)

(58) Field of Classification Search
CPC .. H01J 37/3455; H01J 37/3435; H01J 37/342; H01J 37/3405; C23C 14/54; C23C 14/35
See application file for complete search history.

(56) References Cited

U.S. PATENT DOCUMENTS 8,137,519 B2 *  3/2012  Itagaki ................... C23C 14/35
                                                    204/192.12
2009/0229970 A1  9/2009  Itagaki et al.
(Continued)

FOREIGN PATENT DOCUMENTS

DE        102014110001 A1    1/2016

OTHER PUBLICATIONS

Machine Translation DE 102014110001 (Year: 2014).*

*Primary Examiner* — Michael A Band
(74) *Attorney, Agent, or Firm* — Potomac Technology Law, LLC

(57) ABSTRACT

A magnetron assembly for magnetron sputtering with rotary cathode systems is provided. The magnetron assembly comprises a plurality of magnets attached to a plurality of yokes and a plurality of driving modules, each comprising an actuating mechanism operatively coupled to at least one of the plurality of yokes. The plurality of driving modules are adapted for adjusting the position of the plurality of yokes individually.

12 Claims, 7 Drawing Sheets

(52) U.S. Cl.
CPC ........ *H01J 37/3405* (2013.01); *H01J 37/342* (2013.01); *H01J 37/3435* (2013.01)

(56) References Cited

U.S. PATENT DOCUMENTS

| | | |
|---|---|---|
| 2014/0246312 A1 | 9/2014 | Crowley et al. |
| 2017/0029940 A1* | 2/2017 | Van De Putte ..... H01J 37/3452 |
| 2022/0028673 A1* | 1/2022 | Wagner ............. H01J 37/32935 |

* cited by examiner

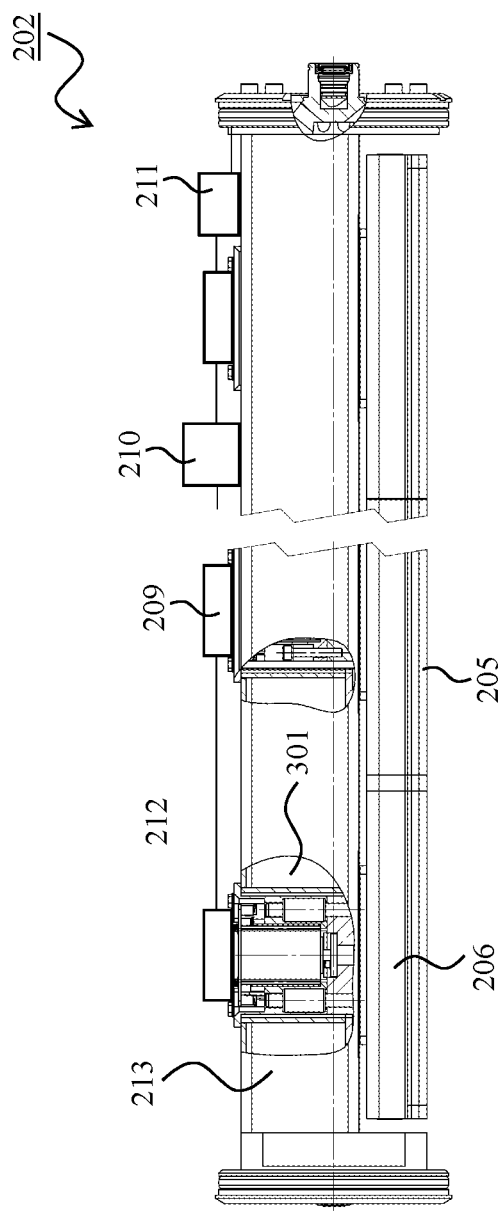
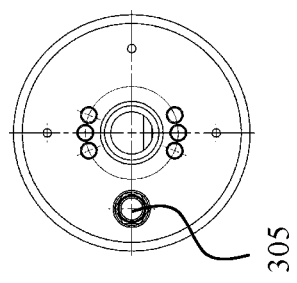
Fig. 3C
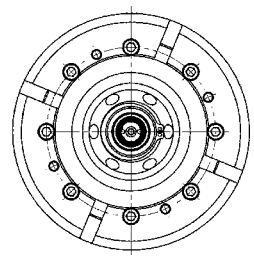
Fig. 3B
Fig. 3A

ROTARY MAGNETRON SPUTTERING WITH INDIVIDUALLY ADJUSTABLE MAGNETIC FIELD

RELATED APPLICATIONS

This application claims the benefit under 35 U.S.C. § 371 from PCT Application Serial No. PCT/EP2020/059830 (filed 2020 Apr. 7), which claims priority to the earlier filing date from European Patent Application No. 19171486.4 (filed 2019 Apr. 29), the entireties of which are incorporated herein by reference.

TECHNICAL FIELD

The present invention is in the field of magnetron sputtering coating deposition especially with rotating sputtering cathodes. More specifically, one of the major but not limitative scope of application of the invention refers to coating on a wide variety of substrates, such as glass.

BACKGROUND OF THE INVENTION

Magnetron sputtering with rotary cathodes has long been employed in the glass coating industry since it has been proved to maximize target material usage while creating uniform coating films. This has been achieved by rotating a target tube around a stationary magnetron placed inside of the tube. Such a magnetron is directed at a substrate, within a vacuum chamber, producing and holding a plasma in a desired location for coating the target material onto a substrate.

The distance between the target surface and the magnets, nevertheless, is reduced due to target erosion. As a result, the intensity of the magnetic field generated by the magnets is increased, which in turn yields local alterations of the plasma that can lead to non-uniform coating across the substrate.

In practical implementation, therefore, coating thickness uniformity suffers from variations that demand for corrections and adjustments during sputtering operation.

US 2014/0246312 A1 discloses a magnetron assembly for a rotary target cathode comprising an elongated support structure, a magnet bar structure movably positioned below the support structure, and a plurality of drive modules coupled to the support structure. Each of the drive modules includes a motorized actuation mechanism operatively coupled to the magnet bar structure. The magnet bar structure includes an array of substantially parallel rows of magnets attached to a single yoke.

It is a drawback of the above-mentioned document that the shape of the magnet bar structure as a whole is modified by the actuation mechanisms. Since the magnets are attached to a single yoke, modification of the magnetic field essentially relies on bending the magnet bar. This restrains the precise control of the magnetic field shape and intensity in a specific location and therefore limits the possibility to precisely control the plasma intensity and, therefore, to locally modify coating non-uniformities.

Thus, it is an object of the present invention to provide a magnetron assembly, a rotary cathode assembly and a method for locally controlling the magnetic field generated by the magnetron assembly in a sputtering apparatus to modify the plasma and the coating deposition rates, so that any non-uniformities in substrate coating can be avoided and/or corrected during production.

SUMMARY OF THE INVENTION

In view of the above-mentioned problems and disadvantages, the present invention aims to provide a system and a method for locally adjusting the position of magnets attached to individual yokes in a magnetron assembly for magnetron sputtering with rotary target cathodes, which enables control of coating thickness uniformity and adaption thereof during production.

The object of the present invention is achieved by the solution provided in the enclosed independent claims. Advantageous implementations of the present invention are further defined in the dependent claims.

According to the first aspect of the invention, a magnetron assembly for magnetron sputtering is provided. The magnetron assembly comprises a plurality of magnets attached to a plurality of yokes and a plurality of driving modules, each comprising an actuating mechanism operatively coupled to at least one of the plurality of yokes. The plurality of driving modules are adapted for adjusting the position of the plurality of yokes individually. Advantageously, an accurate control of magnetic field intensity and shape at specific positions can be achieved owing to the precise manipulation of the individual magnets and individual yokes, enabling to locally adjust and correct coating non-uniformities along a substrate directly during operation of a magnetron sputtering apparatus. This enhances efficiency, saves time and reduces operation costs.

According to a first preferred implementation form of the first aspect of the invention, the plurality of driving modules of the magnetron assembly are attached along an elongated support bar and displace the yokes, whereby the displacement has a component perpendicular to the elongated support bar. Advantageously, efficiency and precision are enhanced.

According to a second preferred implementation form of the first aspect of the invention, each of the actuating mechanisms provided by the plurality of driving modules comprises at least one actuator, which can be controlled separately from the other actuators. Advantageously, precision is further enhanced, which also increases efficiency.

According to a further preferred implementation form of the first aspect of the invention, each actuator comprises a stepper motor that displaces the respective yoke away from and/or toward an elongated support bar, and at least one stopper defining a maximum and a minimum displacement of the yoke with respect to the elongated support bar. This is beneficial, since a fine control of the magnetic field intensity at a specific location is achieved, which improves coating when the magnetron is incorporated into a sputtering apparatus.

According to a further preferred implementation form of the first aspect of the invention, the magnetron assembly further comprises a plurality of slave controllers connected to a master controller, whereby each of the slave controllers is in operative communication with a corresponding driving module. This is beneficial since fully or partial automated control can be implemented, increasing precision and efficiency.

According to a further preferred implementation form of the first aspect of the invention, the master controller receives signals from outside the magnetron assembly and sends signals to outside the magnetron assembly, which preferably are light signals carried by at least one optical fiber. In addition to this or as an alternative, the driving modules displace the yokes in accordance with signals sent from the master controller and received through the corresponding slave controller, sending a confirmation signal to the master controller after the corresponding yoke has been displaced. This is beneficial, since integration of the magnetron assembly with other components of a sputtering apparatus is facilitated.

According to a further preferred implementation form of the first aspect of the invention, the magnetron assembly also comprises at least one rechargeable battery in operative communication with the driving modules. The at least one rechargeable battery is configured to energize the actuation mechanisms, the slave controllers and the master controller. Advantageously, complexity is reduced, saving time and reducing costs.

According to a further preferred implementation form of the first aspect of the invention, the magnetron assembly additionally comprises at least one cooling fluid pipe attached to an elongated support bar and placed along one side of the plurality of individual yokes. This is beneficial, since corrosion is avoided, reducing costs and increasing the lifetime of the magnetron.

According to a further preferred implementation form of the first aspect of the invention, the magnetron assembly further comprises a protective tube which encloses the plurality of magnets attached to the plurality of yokes, the plurality of driving modules, the plurality of actuation mechanisms provided by the driving modules, an elongated support bar, a plurality of slave controllers, a master controller, at least one rechargeable battery and/or at least one cooling fluid pipe. Advantageously, efficiency is increased.

According to a second aspect of the invention, a rotary cathode assembly for a magnetron sputtering apparatus is provided. The rotary cathode assembly comprises a magnetron assembly according to embodiments of the first aspect of the invention having a protective tube and a hollow target cathode. The hollow target cathode encloses the protective tube of the magnetron assembly, defining a passage formed between the inner surface of the hollow target cathode and the outer surface of the protective tube. Moreover, the ends of the rotary cathode assembly are configured to be rotatably attachable to the sputtering apparatus. Advantageously, sputtering of a target material onto a substrate is achieved with high efficiency.

According to a first preferred implementation form of the second aspect of the invention, the magnetron assembly is adapted to adjust the position of the plurality of yokes individually with respect to their corresponding distance to the inner surface of a protective tube enclosed by the hollow target cathode. Advantageously, the distance between the magnetic field generated by the magnetron and the target material can be locally varied in an accurate manner due to the precise manipulation of the individual magnets and individual yokes, resulting in a local control of the magnetic field shape and intensity. This enables to locally correct specific coating non-uniformities on a substrate. This is beneficial since corrections can be performed during production, increasing efficiency, saving time and reducing operation costs.

According to a second preferred implementation form of the second aspect of the invention, the passage formed between the outer surface of the protective tube of the magnetron assembly and the inner surface of the hollow target cathode receives cooling fluid from at least one cooling fluid pipe of the magnetron assembly by a fluid guide placed in one of the ends of the rotary cathode assembly. This ensures that corrosion is avoided, reducing costs and increasing the lifetime of the rotary cathode assembly.

According to a further preferred implementation form of the second aspect of the invention, a first end of the rotary cathode assembly comprises means for transferring light signals between a sputtering apparatus and the magnetron assembly having the protective tube enclosed by the hollow target cathode. In addition to this or as an alternative, a second end of the rotary cathode assembly comprises means for supplying a coolant fluid to at least one pipe of the magnetron assembly within the protective tube enclosed by the hollow target cathode, and means for receiving the coolant fluid from the passage formed between the protective tube and the hollow target cathode. Advantageously, efficiency is enhanced and operation costs are reduced.

According to a further preferred implementation form of the second aspect of the invention, the light signals sent and received through the first end of the rotary cathode assembly are carried by at least one optical fiber. This is beneficial, since integration with a sputtering apparatus is enabled.

According to a further preferred implementation form of the second aspect of the invention, at least one of the light signals sent and received through the first end of the rotary cathode assembly corresponds to a particular control signal that determines the displacement of each individual yoke with respect to the inner surface of the protective tube within the magnetron assembly. Advantageously, precision and efficiency are increased.

According to a third aspect of the invention, a method for displacing individual yokes in a magnetron assembly for magnetron sputtering is provided. The method comprises the following steps: providing a plurality of magnets attached to a plurality of yokes, providing a plurality of driving modules, each comprising an actuating mechanism, operatively coupling each actuating mechanism to at least one of the plurality of yokes, and adjusting the positions of the plurality of yokes individually by the driving modules. Advantageously, control of the magnetic field intensity at specific positions can be achieved, enabling to locally adjust and correct coating non-uniformities along a substrate during operation of a magnetron sputtering apparatus. This enhances efficiency and reduces costs.

BRIEF DESCRIPTION OF THE DRAWINGS

Illustrative embodiments of the present invention are further explained by way of example only, and not for limitation, with respect to the accompanying drawings in which like reference numerals refer to similar elements. It is mentioned that the various features are not necessarily drawn to scale. In the drawings:

FIG. 3A shows a second embodiment of the invention for a magnetron assembly comprised in a rotary cathode assembly with the protective tube removed, according to another aspect of the invention;

FIG. 3B shows a first end view of the magnetron assembly of FIG. 3A with the protective tube removed;

FIG. 3C shows a second end view of the magnetron assembly of FIG. 3A with the protective tube removed;

DETAILED DESCRIPTION OF THE INVENTION

The present invention will be described with respect to particular embodiments and with reference to certain drawings but the invention is not limited thereto. In the description and in the claims, the indefinite article a or an does not exclude a plurality. Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are generally employed for descriptive purposes and not necessarily for comprehensively describing exclusive relative positions. It is to be understood that any of the preceding terms so used may be interchanged under appropriate circumstances such that various embodiments of the invention described herein are capable of operation in other configurations and/or orientations than those described or illustrated herein.

Figure 1:
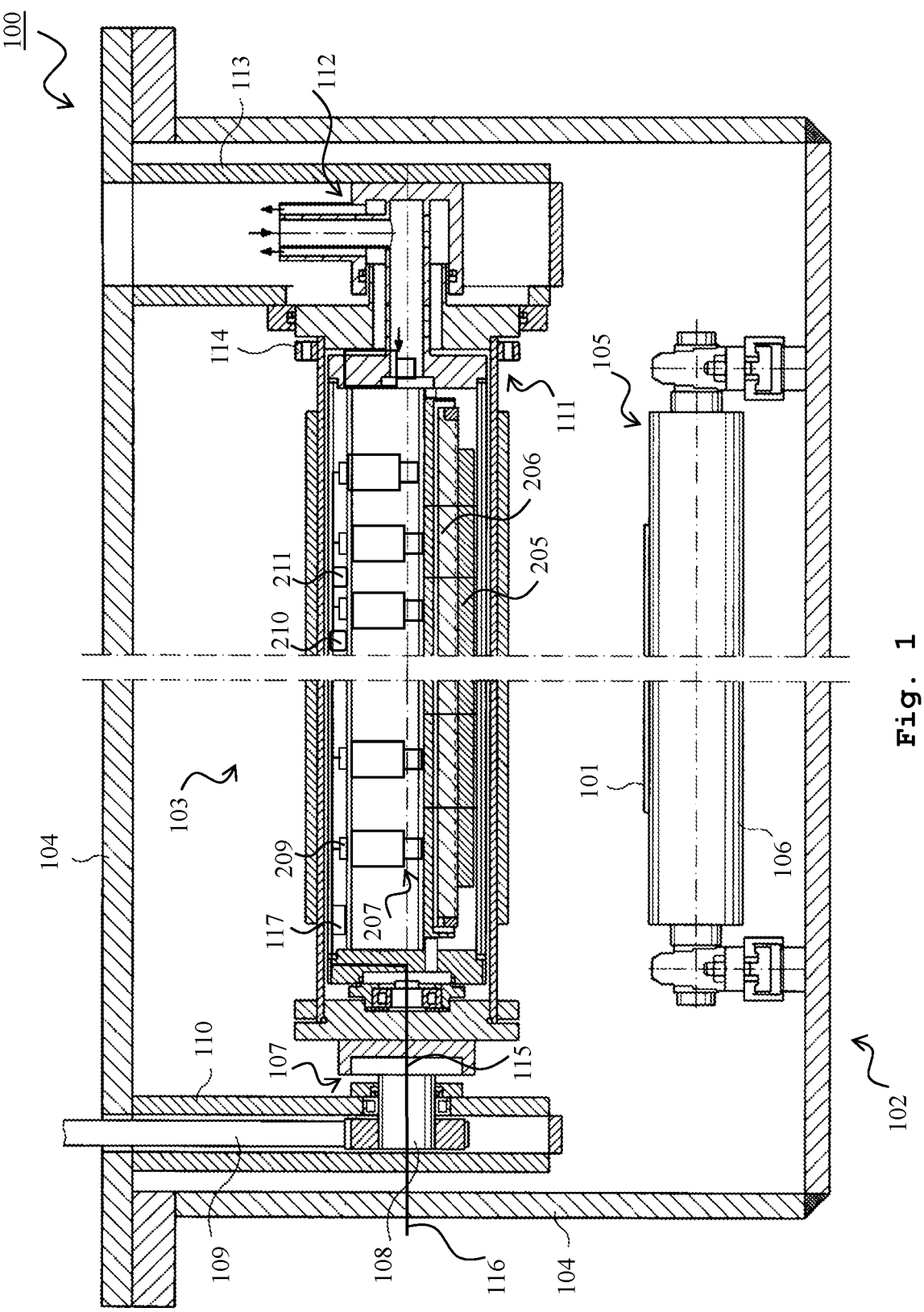
FIG. 1 shows a first embodiment of a sputtering apparatus in a cross-sectional view, comprising a magnetron assembly and a rotary cathode assembly according to the present invention.

FIG. 1 shows an overall schematic representation of a sputtering apparatus 100 according to one embodiment of the invention, which is configured for magnetron sputtering with rotary cathodes. The sputtering apparatus 100 comprises a substrate 101 placed within a vacuum chamber 102 having an outer wall 104. The substrate 101 to be coated is guided to pass below a rotary cathode assembly 103 by using, for example, a conveyor 105 having a plurality of rollers 106. The substrate 101 refers to large-area substrates, for example flat glass but not limited to glass.

A first end 107 of the rotary cathode assembly 103 within the vacuum chamber 102 is rotatably attached, through a shaft 108, to a drive structure 109 that is adapted to rotate the rotary cathode assembly 103 and all its components, which will be described below in the description, about its main axis. The drive structure 109 may be embodied, for example, in the form of a toothed belt drive or motorized gears or the like mechanism. The vacuum chamber 102 is sealed with respect to a housing 110 supporting the drive structure 109.

As it can be noted in FIG. 1, a coolant fluid inlet and outlet 112 is provided at a second end 111 of the rotary cathode assembly 103. The coolant fluid inlet and outlet 112 can be arranged in a housing 113, which is sealed relative to the vacuum chamber 102. In addition to this, the second end 111 of the rotary cathode assembly 103 is rotatably attached, using a bearing 114, to the housing 113.

In this exemplary embodiment, the sputtering apparatus 100 enables transmission of light signals from outside the vacuum chamber 102 and/or to outside the vacuum chamber 102. The light signals are carried by at least one optical fiber 115 provided at the first end 107 of the rotary cathode assembly 103.

The at least one optical fiber 115 is coupled to at least one external optical fiber 116 outside the vacuum chamber 102, which in turn is in operative communication to an external optical communications systems (not shown), which for example can be further coupled to the substrate 101 after being coated, so that any non-uniformities are detected.

Figure 2A:
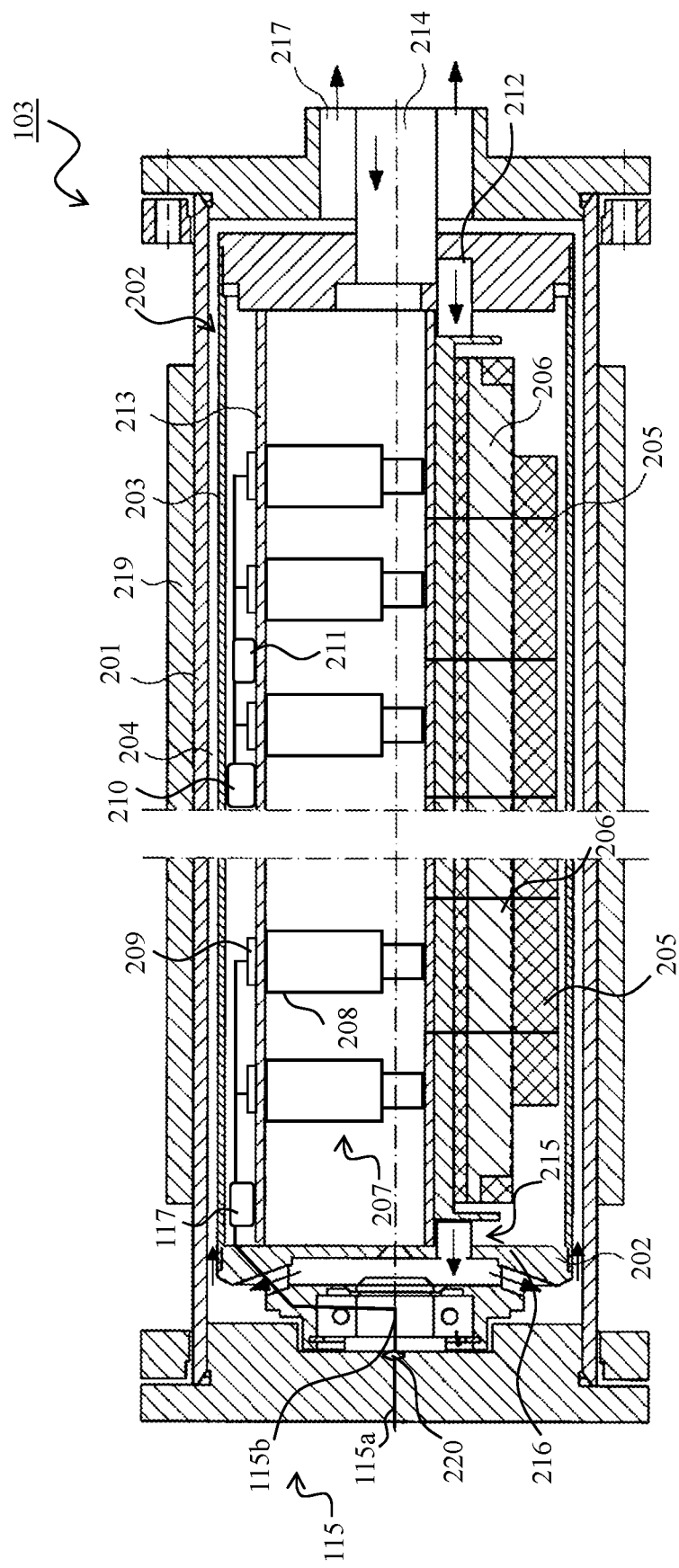
FIG. 2A shows the rotary cathode assembly of the first embodiment according to an aspect of the invention.
Figure 2B:
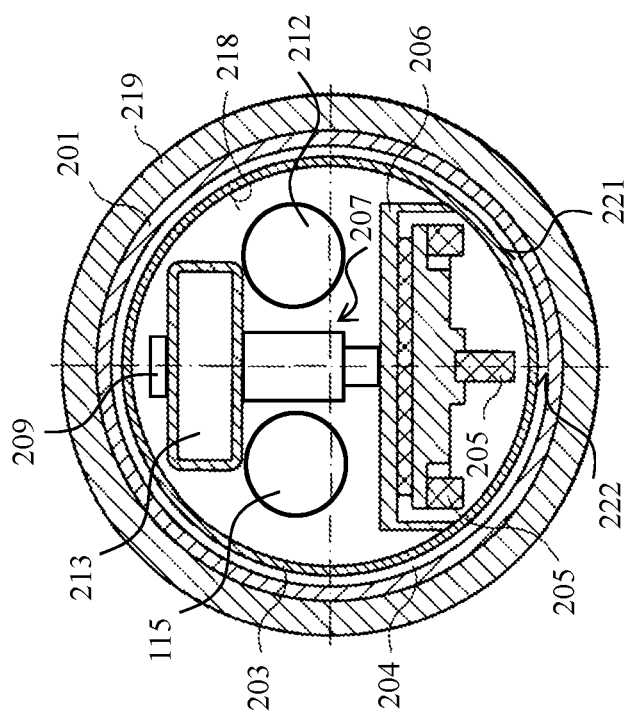
FIG. 2B is a sectional view of the rotary cathode assembly of FIG. 2A.

FIGS. 2A and 2B illustrate the rotary cathode assembly 103 in accord with an aspect of the present invention, which comprises a magnetron assembly 202 having a protective tube 203 enclosed by a hollow target cathode 201, forming a passage 204 between the inner surface 222 of said hollow target cathode 201 and the outer surface 221 of the protective tube 203. The hollow target cathode also comprises a target material 219.

As it will be discussed in detail below, the magnetron assembly 202 comprises a plurality of magnets 205 attached to a plurality of yokes 206, a plurality of driving modules 207, a plurality of actuation mechanisms 208 provided by the driving modules 207, a plurality of slave controllers 209, a master controller 210, at least one rechargeable battery 211 and at least one cooling fluid pipe 212, which are placed within the protective tube 203.

From FIGS. 2A and 2B it is noted that the at least one cooling liquid pipe 212 may be attached to an elongated support bar 213 and placed along one side of the plurality of individual yokes 206.

Especially in the context of FIG. 2A, a cooling fluid is supplied to the at least one cooling fluid pipe 212 of the magnetron assembly 202, via an inlet 214 at the second end 111 of the rotary cathode assembly 103. The cooling fluid flows along the at least one cooling fluid pipe 212, in the direction depicted by the arrows shown in FIG. 2A, until it reaches a fluid guide 215 and exits through lateral bores 216 to the passage 204 formed between the outer surface 221 of the protective tube 203 of the magnetron assembly 202 and the inner surface 222 of the hollow target cathode 201.

Then, the coolant fluid flows through the passage 204 back to the second end 111 of the rotary cathode assembly 103, where it is discharged through an outlet 217. In this manner, the rest of the components of the magnetron assembly, namely the plurality of magnets 205, the plurality of individual yokes 206, the plurality of actuation mechanisms 207, the slave controllers 209, the central controller 210, the support bar 213 and the at least one rechargeable battery 211, are protected from corrosion owing to the coolant fluid while the target is kept appropriately cooled.

Also in the context of FIG. 2A, it is mentioned that the first end 107 of the rotary cathode assembly 103 comprises means for transferring light signals between a sputtering apparatus 100 and the magnetron assembly 202. In this embodiment, the at least one optical fiber 115 may comprise a static part 115a and a rotating part 115b, which are preferably coupled through a lens 220. Furthermore, the at least one optical fiber 115 as well as its the static 115a and rotating 115b parts are sealed with respect to the coolant fluid reaching the fluid guide 215 and the lateral bores 216 at said first end 107, avoiding corrosion.

An exemplary embodiment of the inventive magnetron assembly 202 will be discussed now especially with respect to FIG. 2B, which depicts a lateral view of the magnetron assembly 202 placed within the hollow target cathode 201 of the rotary cathode assembly 103.

As mentioned before, the magnetron assembly 202 comprises a plurality of magnets 205 attached to a plurality of yokes 206. In general, the magnets 205 are formed as substantially parallel rows of permanent magnets 205 mounted on a yoke 206, as shown in FIG. 2B. Each yoke 206 can be made of a metallic material, especially a ferromagnetic material as for example steel, and may be shaped in different forms, for example in a substantially "U" or "E" shape or any other shape that allows to accommodate the magnets 205.

The magnetron assembly 202 further comprises a plurality of driving modules 207. Each driving module 207 comprises an actuating mechanism 208 operatively coupled to at least one of the plurality of yokes 206. The plurality of driving modules 207 are adapted for adjusting the position of the plurality of yokes 206 individually.

In this exemplary embodiment, the plurality of driving modules 207, and therefore the plurality of yokes 206, are attached along an elongated support bar 213, so that the driving modules 207 displace the yokes 206 individually and essentially in a perpendicular manner with respect to the elongated support bar 213.

In this context, it is mentioned that the individual yokes 206 each can have a length, for example, between 100 mm and 300 mm, preferably between 100 mm and 200 mm, and their displacement can be, by way of example, between 5 mm and 30 mm, preferably 12 mm. The plurality of yokes 206 have not necessarily the same length, but each yoke 206 may have a different length. Moreover, the intensity of the magnetic field at each of the plurality of yokes 206 can be of the order of some milliteslas.

With regard to FIG. 2B, it is noted that when the magnetron assembly 202 having a protective tube 203 is placed within the hollow target cathode 201, each of the actuating mechanisms 208 displaces at least one of the yokes 206 towards the inner surface 218 of the protective tube 203 essentially in a perpendicular manner with respect to the elongated support bar 213. Alternatively, each of the actuating mechanisms 208 displaces at least one of the yokes 206 from the inner surface 218 of the protective tube 203 toward the elongated support bar 213, in an essentially perpendicular manner with respect to said elongated support bar 213.

Hence, such a displacement of the yokes 206 vary the distance of the magnets 205 to/from the hollow target cathode 201, enabling to locally control the intensity of a magnetic field generated by the magnets 205 which in turn modifies a generated plasma and therefore allows to control the coating uniformity when the rotary cathode assembly 103 is employed within a sputtering apparatus 100, as shown in FIG. 1.

As mentioned previously, the inventive magnetron assembly 202 further comprises a plurality of slave controllers 209, each of which is in operative communication with a driving module 207. The plurality of slave controllers 209 are connected to a master controller 210. Especially, the master controller 210 is adapted to send and receive signals to and from outside the magnetron assembly 202, respectively, which are light signals carried by the at least one optical fiber 115, especially its rotating part 115b, which is passed through an optical-electrical signal converter 117.

Moreover, each driving module 207 displaces the yokes 206 in accordance with signals received from the master controller 210 through a corresponding slave controller 209, sending a confirmation signal back to the master controller 210 after the corresponding yoke 206 has been displaced.

It is also mentioned that the master controller 210 may receive a signal from outside a sputtering apparatus 100, through at least an external optical fiber 116, which comprises information regarding any coating non-uniformities on a substrate 101 to be corrected by displacing at least one of the plurality of yokes 206.

The at least one rechargeable battery 211, which is in operative communication with the driving modules 207, is configured to energize the actuation mechanisms 208, the slave controllers 209 and the master controller 210.

FIGS. 3A to 3C depict a second embodiment of the inventive magnetron assembly 202 with the protective tube 203 removed for the sake of clarity. In the context of FIG. 3A, it is mentioned that the at least one rechargeable battery 211 may be charged externally, for example through a plug 305 shown in FIG. 3C. This is beneficial, since charging and replacement of the at least one rechargeable battery 211 can be performed for example during equipment maintenance, saving time and operation costs. The battery 211 might alternatively be charged by an internal generator driven by a turbine rotated by the flow of the cooling fluid.

Figure 3D:
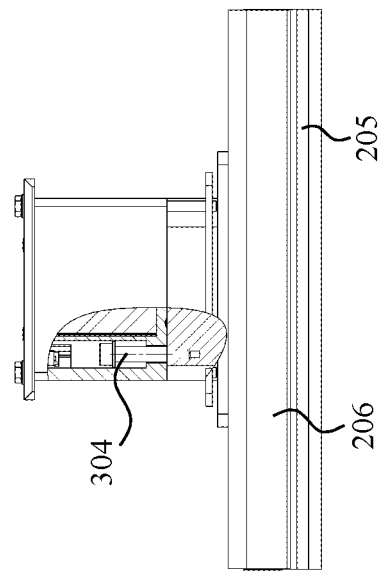
FIG. 3D shows an enlarged view of an exemplary actuating mechanism of the magnetron assembly of FIG. 3A.
Figure 3E:
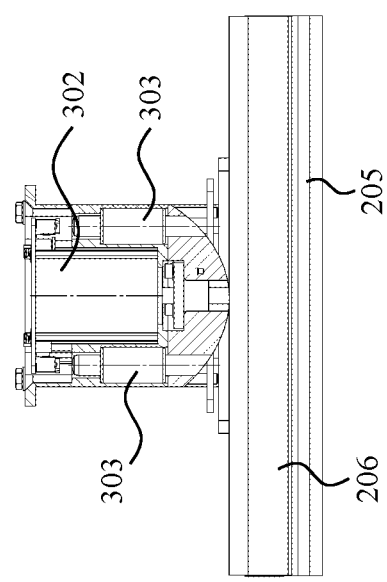
FIG. 3E shows another enlarged view of an exemplary actuating mechanism of the magnetron assembly of FIG. 3A.

The actuating mechanisms 208 provided by the plurality of driving modules 207 may comprise at least one actuator 301, as depicted in FIGS. 3D and 3E, which can be controlled separately from the other actuators. The at least one actuator 301 can be implemented, for example, as a motorized actuator, a hydraulic actuator, a pneumatic actuator, a piezoelectric actuator or the like.

By way of example, FIG. 3D shows that the at least one actuator 301 is implemented as a step motor linear actuator 302. The step motor linear actuator 302 is adapted to displace a corresponding yoke 206 away from and/or toward the elongated support bar 213 in accord with a signal received through a slave controller 209 form the master controller 210.

In general, the at least one actuator 301 also comprises at least one stopper 304, as depicted in FIG. 3E, defining a maximum and a minimum displacement of a corresponding yoke 206 with respect to the elongated support bar 213. Such a maximum or minimum displacement may be determined in additional ways, for example by means counting the number of steps of the motor in the case that the at least one actuator is a step motor linear actuator 302, or by a predetermined light signal transmitted to/from outside a sputtering apparatus 100, or by other mechanisms.

The at least one actuator 301 may also comprise at least one vertical pin 303, exemplary two pins 303 shown in FIG. 3D, which prevents tilting of a corresponding yoke 206 while being displaced.

Figure 4A:
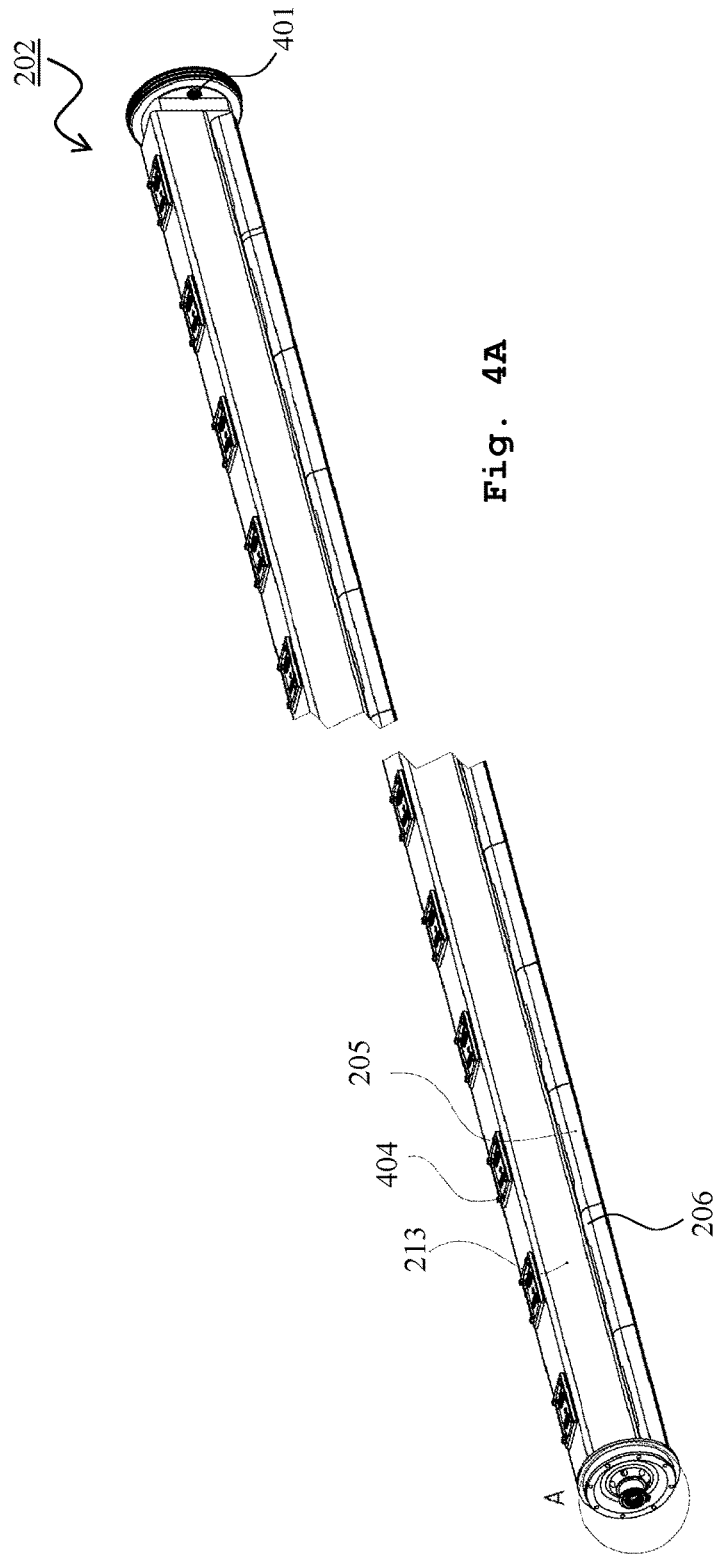
FIG. 4A depicts a third embodiment showing the magnetron assembly with the protective tube removed.
Figure 4B:
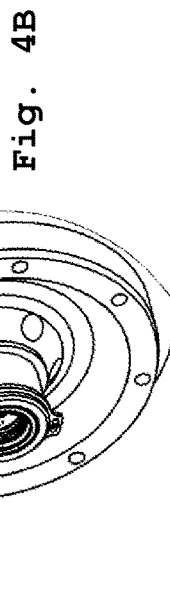
FIG. 4B shows an enlarged sectional view of an end portion of the magnetron assembly in area A of FIG. 4A.

FIGS. 4A and 4B illustrate a third embodiment of the magnetron assembly 202 where the protective tube 203, the slave controllers 209, the master controller 210 and the at least one rechargeable battery 211 were removed for clarity.

Especially, FIG. 4B shows a receiver 402 placed at one of the ends of the magnetron assembly 202 in the area A of FIG. 4A, which receives the at least one optical fiber 115 carrying light signals sent and received by the central controller 210. In this embodiment, the receiver 402 is in optical communication directly with the optical fiber static part 115a or alternatively with the lens 220 and, thus, the optical fiber rotary part 115b and the optical-electrical converter 117 as described in the embodiment shown in FIG. 2A, are rendered superfluous. This is beneficial, since complexity is reduced.

FIG. 4B further shows a rotary shaft seal 403 which enables to rotatably attach the rotary cathode assembly 103, enclosing the magnetron assembly 202, to a vacuum chamber 102 of a sputtering apparatus 100 as depicted in FIG. 1.

Also when enclosed within a rotary cathode assembly 103, the at least one cooling fluid pipe 212 of the magnetron assembly 202 is adapted to receive cooling fluid from a sputtering apparatus 100, as explained before, through a receptacle 401 depicted in FIG. 4A, in which a plurality of bracket assemblies 404 for the actuating mechanisms 208 are also shown.

Figure 5:
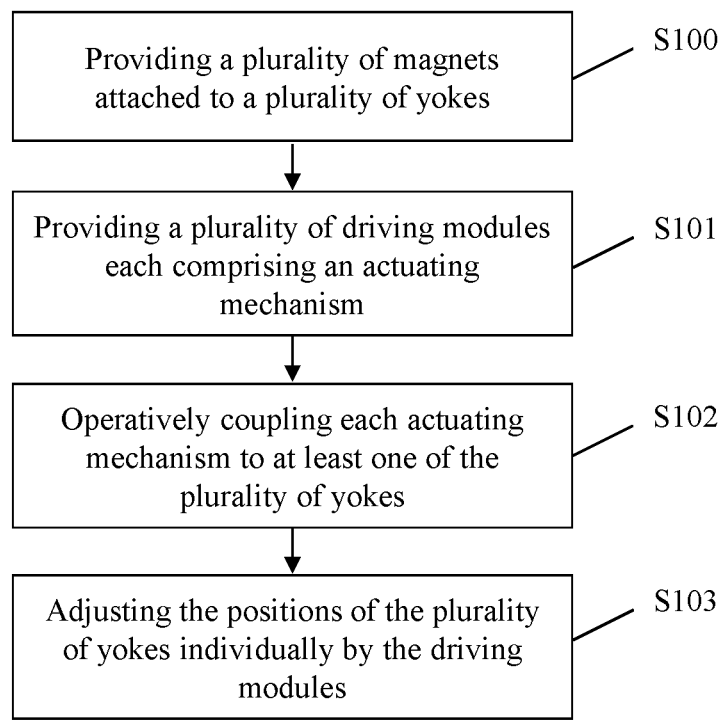
FIG. 5 shows a flow chart of a representative embodiment of the inventive method according to the third aspect of the invention.

Now, a flow chart of an embodiment of the inventive method is shown in FIG. 5. In a first step S100, a plurality of magnets 205 attached to a plurality of yokes 206 are provided. In a second step S101, a plurality of driving modules 207, each comprising an actuating mechanism 208 are also provided. The inventive method may further comprise that the driving modules 207 are attached to a supporting bar 213.

In a third step S102, each actuating mechanism 208 is operatively coupled to at least one of the plurality of yokes 206. In a subsequent step S103, the driving modules 207 are configured, through the actuating mechanisms 208, to adjust the positions of the plurality of yokes 206 individually.

The method may further comprise the optional steps of placing the magnetron assembly 202, having a protective tube 203, within a hollow target cathode 201 and defining a passage formed between the inner surface 222 of the hollow target cathode 201 and the outer surface 221 of the protective tube 203, and adjusting the position of the plurality of yokes individually with respect to their corresponding distance to the inner surface of a protective tube enclosed by the hollow target cathode. In this manner, the distance between the magnetic field generated by the magnetron assembly 202 and a hollow target cathode 201 is locally adjusted, enabling controlling and correcting any non-uniformities in the coating obtained on a substrate 101.

Finally, it is mentioned that throughout the present disclosure it is not excluded that an actuating mechanism 208 may also be adapted to displace groups of yokes 206 at a time. Also, it is not excluded that more than one actuating mechanisms 208 may be adapted to displace a single yoke 206. By way of example, two or more yokes 206 can be displaced simultaneously by an actuating mechanism 208, or any combination thereof.

While various embodiments of the present invention have been described above, it should be understood that they have been presented by way of example only, and not limitation. Numerous changes to the disclosed embodiments can be made in accordance with the disclosure herein without departing from the scope of the invention. Thus, the breadth and scope of the present invention should not be limited by any of the above described embodiments. Rather, the scope of the invention should be defined in accordance with the appended claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A magnetron assembly configured within a hollow cathode target for magnetron sputtering comprising:
   a plurality of magnets attached to a plurality of yokes;
   a plurality of driving modules, the driving modules each comprising an actuating mechanism operatively coupled to at least one corresponding yoke of the plurality of yokes; and
   a plurality of slave controllers connected to a master controller; and
   wherein the plurality of slave controllers and the master controller are located within the magnetron assembly,
   wherein each of the slave controllers is in operative communication with a corresponding one of the plurality of driving modules,
   wherein each of the plurality of driving modules is adapted to displace the at least one corresponding yoke of the plurality of yokes individually,
   wherein each of the driving modules is adapted to displace the at least one corresponding yoke in accordance with signals sent from the master controller and received through the corresponding slave controller, and to send a confirmation signal to the master controller after the corresponding yoke has been displaced,
   wherein the magnetron assembly is configured to be contained within a rotary cathode assembly, which comprises at least one optical fiber coupled to a first end of the rotary cathode assembly, wherein the at least one optical fiber includes a static part and a rotating part coupled through a lens, wherein the master controller is configured to send the signals to the magnetron assembly and receive the confirmation signal from the magnetron assembly via the at least one optical fiber, and
   a protective tube contained within the rotary cathode assembly, wherein the protective tube contains the plurality of magnets, the plurality of driving modules, the plurality of actuating mechanisms, an elongated support bar, the plurality of slave controllers, the master controller, at least one rechargeable battery and at least one cooling fluid pipe.

2. The magnetron assembly according to claim 1, wherein the plurality of driving modules are attached along the elongated support bar and each is configured to displace the at least one corresponding yoke of the plurality of yokes by a displacement which comprises a component perpendicular to the elongated support bar.

3. The magnetron assembly according to claim 1, wherein each of the actuating mechanisms comprises at least one actuator, wherein the at least one actuator of each of the actuating mechanisms is configured to be controlled separately from the actuators of each of the other actuating mechanisms.

4. The magnetron assembly according to claim 3, wherein each actuator comprises a stepper motor that displaces the respective yoke away from and/or toward an elongated support bar, and at least one stopper defining a maximum and a minimum displacement of the yoke with respect to the elongated support bar.

5. The magnetron assembly according to claim 1,
   wherein the master controller receives signals from outside of the magnetron assembly and sends signals to the outside of the magnetron assembly, wherein the signals are light signals carried by the at least one optical fiber.

6. The magnetron assembly according to claim 1, further comprising wherein:
   the at least one rechargeable battery is in operative communication with the driving modules, wherein the at least one rechargeable battery is configured to energize the actuating mechanisms, the slave controllers and the master controller.

7. The magnetron assembly according to claim 1, wherein:
   the at least one cooling fluid pipe is attached to the elongated support bar and positioned along one side of the plurality of yokes.

8. A rotary cathode assembly for a magnetron sputtering apparatus, the rotary cathode assembly comprising:
  the magnetron assembly according to claim 1; and
  the hollow target cathode enclosing the protective tube of the magnetron assembly and defining a passage formed between an inner surface of the hollow target cathode and an outer surface of the protective tube; and
  wherein the first end and a second end of the rotary cathode assembly are configured to be rotatably attachable to the magnetron sputtering apparatus.

9. The rotary cathode assembly according to claim 8, wherein the magnetron assembly is adapted to adjust a position of the plurality of yokes individually with respect to a corresponding distance to the inner surface of the protective tube enclosed by the hollow target cathode.

10. The rotary cathode assembly according to claim 8, wherein the passage formed between the outer surface of the protective tube of the magnetron assembly and the inner surface of the hollow target cathode receives cooling fluid from the at least one cooling fluid pipe of the magnetron assembly by a fluid guide placed in a one of the first and second ends of the rotary cathode assembly.

11. The rotary cathode assembly according to claim 8,
  wherein the first end of the rotary cathode assembly comprises a means for transferring light signals between the magnetron sputtering apparatus and the magnetron assembly having the protective tube enclosed by the hollow target cathode, and/or
  wherein the second end of the rotary cathode assembly comprises a means for supplying a coolant fluid to the at least one cooling pipe of the magnetron assembly within the protective tube enclosed by the hollow target cathode, and a means for receiving the coolant fluid from the passage formed between the inner surface of the hollow target cathode and the outer surface of the protective tube.

12. The rotary cathode assembly according to claim 8, wherein at least one of the signals sent to the magnetron assembly via the at least one optical fiber corresponds to a control signal that determines a displacement of each individual yoke with respect to the inner surface of the protective tube within the magnetron assembly.

\* \* \* \* \*